United States Patent [19]
Hatori

[11] Patent Number: 5,550,771
[45] Date of Patent: Aug. 27, 1996

[54] PROGRAMMABLE SEMICONDUCTOR INTEGRATED CIRCUIT

[75] Inventor: Fumitoshi Hatori, Tachikawa, Japan

[73] Assignee: Kabushiki Kaisha Toshiba, Tokyo, Japan

[21] Appl. No.: 463,379

[22] Filed: Jun. 5, 1995

[30] Foreign Application Priority Data

Jun. 3, 1994 [JP] Japan ................................. 6-122722

[51] Int. Cl.⁶ ..................................................... G11C 11/34
[52] U.S. Cl. .......................... 365/174; 365/154; 365/104; 326/39
[58] Field of Search ........................... 365/174, 154, 365/156, 104; 326/39, 40

[56] References Cited

U.S. PATENT DOCUMENTS 5,046,044  9/1991  Houston et al. ............... 365/154 X
5,301,146  4/1994  Hama ................................. 365/154
5,408,138  4/1995  Khosravi et al. .............. 365/154 X Primary Examiner—David C. Nelms
Assistant Examiner—Huan Hoang
Attorney, Agent, or Firm—Loeb & Loeb LLP

[57] ABSTRACT

A programmable semiconductor integrated circuit constructed as a Field Programmable Gate Array (FPGA) comprises basic cells each comprised of; a first stable circuit having first and second nodes and operative to respectively output, in the steady state, power supply potential and ground potential from the first and second nodes; a second stable circuit having third and fourth nodes and operative to respectively output, in the steady state, ground potential and power supply potential from the third and fourth nodes; and a control circuit for selectively connecting any one of a node pair comprised of the first and second nodes of the first stable circuit and a node pair comprised of the third and fourth nodes of the second stable circuit, or the both node pairs to first and second bit lines.

22 Claims, 11 Drawing Sheets

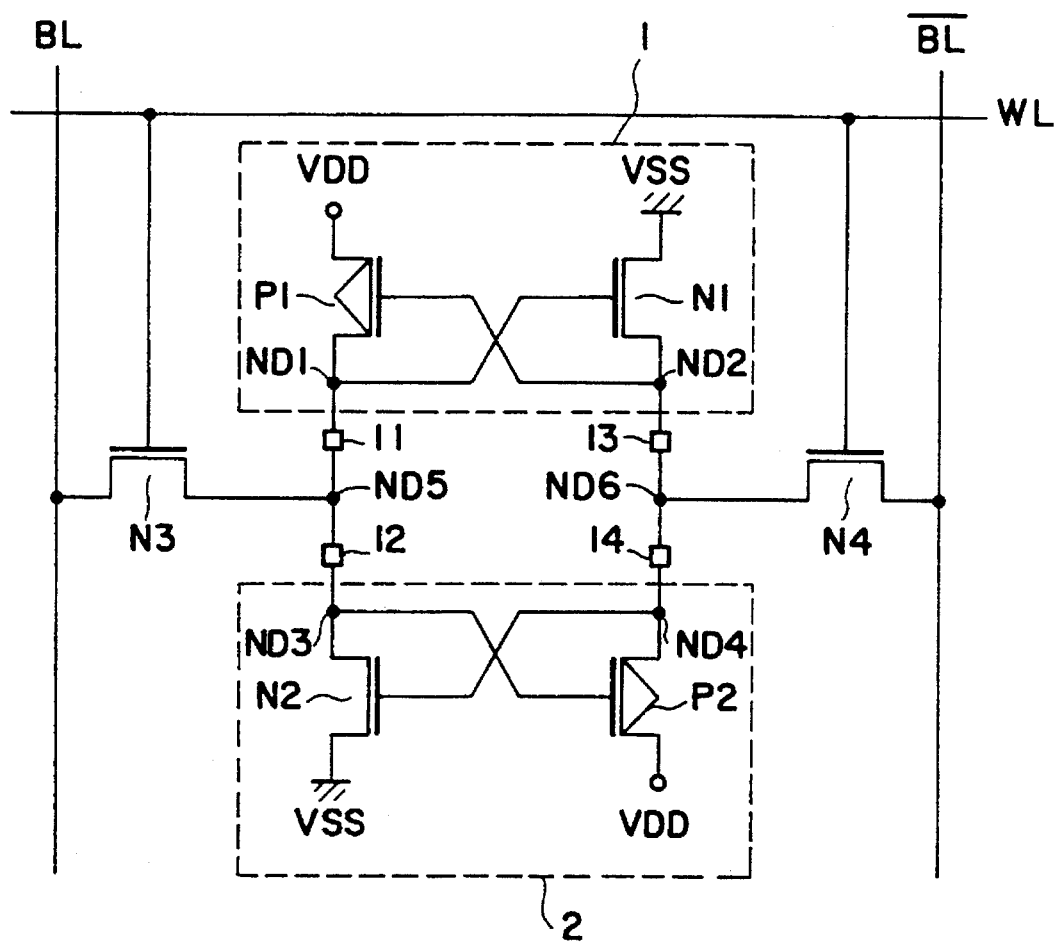
F I G. 1
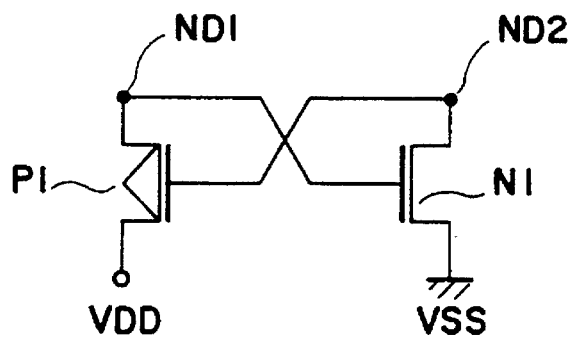
F I G. 2

PROGRAMMABLE SEMICONDUCTOR INTEGRATED CIRCUIT

BACKGROUND OF THE INVENTION

This invention relates to a programmable semiconductor integrated circuit.

In recent years, Application Specified ICs (hereinafter referred to as ASICs) have been widely used as small quantity products and/or ICs for prototyping. For ASICs, there are ASICs customized so as to become in correspondence with the specification that consumers or customers request at the mask level, such as, for example, Gate Array (hereinafter referred to as GA) or Standard Cell (hereinafter referred to as SC), and ASICs customized after they have been at hands of customers or consumers, such as, for example, Programmable Logic Array (PLA).

In the case of GA and/or SC, there is a feature that it realizes any logic circuits, but cost of development is high and term of development is long. On the other hand, in the case of PLA, cost is low and term of development is short, but there is limitation in kind of circuits which can be realized.

In view of the above, there have been developed, with a view to compensating the drawbacks of the both techniques mentioned above, devices called Field Programmable Gate Array (hereinafter referred to as FPGA), which are capable of realizing any logic circuits as in the case of GA, and are permitted to be customized after they have been at hands of consumers or customers as in the case of PLA. In FPGA, basic (fundamental) cells each comprised of a transistor or plural transistors, and wiring and program elements for connecting between those basic cells are arranged in advance. Customers or consumers make programming with respect to program elements to thereby obtain circuits of desired functions.

However, in the conventional FPGA, there was a problem that area efficiency is low when compared to customized circuits having the same function. Particularly, when attempt is made to realize circuits in which elements are regularly arranged like in memory circuits, utilization efficiency of wiring resource was also disadvantageously lowered.

SUMMARY OF THE INVENTION

Accordingly, an object of this invention is to provide a FPGA which permits higher area efficiency and higher wiring resource utilization efficiency in the case of constituting memory circuitry.

A programmable semiconductor integrated circuit of this invention comprises basic cells each composed of: a first stable circuit having first and second nodes which output, in the steady state, power supply potential and ground potential respectively; a second stable circuit having third and fourth nodes which output, in the steady state, ground potential and power supply potential respectively; and a control circuit operative to selectively connect, to first and second bit lines, any one of a node pair which comprises the first and second nodes of the first stable circuit and a node pair which comprises the third and fourth nodes of the second stable circuit, or both node pairs, thus to program the function of the control circuit, thereby permitting the basic cell to have any one of functions of read only memory cell or rewritable memory cell.

For example, the above-mentioned control circuit may comprise first and second programmable switch elements connected in series between the first node and the third node, and third and fourth programmable switch elements connected in series between the second node and the fourth node; and a first pass transistor having source and drain connected to a fifth node connecting the first and second programmable switch elements connected in series and to the first bit line, and a second pass transistor having source and drain connected to a sixth node connecting the third and fourth programmable switch elements connected in series and to the second bit line to selectively carry out programming with respect to the first through fourth programmable switch elements to set respective impedance values to thereby allow the basic cell to have function of read only memory or rewritable memory to permit data thereof and inverted data thereof to be outputted to the first and second bit lines.

In more practical sense, in the case where the basic cell is used as a read only memory cell, it is sufficient to allow only the first and third programmable switch elements to have low impedance, or to allow only the second and fourth programmable elements to have low impedance. Moreover, in the case where the basic cell is used as a rewritable memory cell, it is sufficient to allow all the first through fourth programmable switch elements to have low impedance.

Further, in the programmable semiconductor integrated circuit of this invention, the above-mentioned control circuit comprises: a first programmable switch element connected between the first node and the third node; a second programmable switch element connected between the second node and the fourth node; a first transistor having source and drain connected to the first node and the first bit line; a second transistor having source and drain connected to the second node and the second bit line, and gate connected to gate of the first transistor; a third transistor having source and drain connected to the third node and the first bit line; a fourth transistor having source and drain connected to the fourth node and the second bit line and gate connected to gate of the third transistor; third and fourth programmable switch elements connected in series between the gate of the first transistor and the gate of the third transistor; and fifth and sixth programmable switch elements connected in series between the gate of the second transistor and the gate of the fourth transistor, wherein a fifth node connecting the third and fourth programmable switch elements connected in series is connected to a terminal of potential sufficient to allow the first through fourth transistors to be turned OFF, and a sixth node connecting the fifth and sixth programmable switch elements connected in series is connected to word line to selectively carry out programming with respect to the first through sixth programmable switch elements to set respective impedance values to thereby allow the basic cell to have function of read only memory or rewritable memory, thus permitting data thereof and inverted data thereof to be outputted to the first and second bit lines.

In more practical sense, in the case where the basic cell is used as a read only memory cell, it is sufficient to allow only the third and sixth programmable switch elements to have low impedance, or to allow only the fourth and fifth programmable switch elements to have low impedance. Moreover, in the case where the basic cell is used as a rewritable memory cell, it is sufficient to allow the first and second programmable switch elements, and the fifth and sixth programmable switch elements to have low impedance.

Moreover, the above-mentioned first stable circuit may include a first P-channel transistor having source connected to power supply potential terminal, drain connected to the first node and gate connected to the second node, and a first N-channel transistor having source connected to ground potential terminal, drain connected to the second node, and gate connected to the first node thus to respectively output, in the steady state, power supply potential and ground potential from the first and second nodes; and the second stable circuit may include a second P-channel transistor having source connected to power supply potential terminal, gate connected to the third node, and drain connected to the fourth node, and a second N-channel transistor having source connected to ground potential terminal, drain connected to the third node and gate connected to the fourth node to respectively output, in the steady state, ground potential and power supply potential from the third and fourth nodes.

As the programmable switch means, there may be employed an element such that impedance is caused to be irreversibly lower after programming. Alternatively, there may be employed an element such that impedance is caused to be irreversibly higher after programming.

By the basic cell composed of two kinds of stable circuits and the control circuit capable of programming function of connecting these stable circuits and bit line and inverted bit line, it is possible to improve area efficiency and wiring resource utility in constituting the function of read only memory or rewritable memory.

BRIEF DESCRIPTION OF THE DRAWINGS

FIG. 1 is a circuit diagram showing the configuration of a programmable semiconductor integrated circuit according to a first embodiment of this invention.

FIG. 2 is a circuit diagram showing the configuration of a first stable circuit used in the programmable semiconductor integrated circuit.

DESCRIPTION OF THE PREFERRED EMBODIMENTS

Preferred embodiments of this invention will now be described with reference to the attached drawings.

Figure 3:
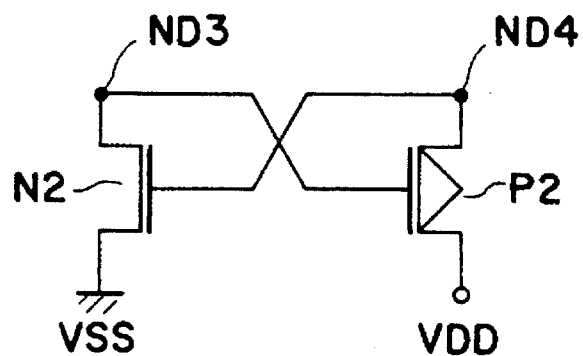
FIG. 3 is a circuit diagram showing the configuration of a second stable circuit used in the programmable semiconductor integrated circuit.

Initially, the configurations of first and second stable circuits used as a basic element of cell are respectively shown in FIGS. 2 and 3.

As shown in FIG. 2, the first stable circuit includes a P-channel type MOS transistor P1 and an N-channel type MOS transistor N1, wherein source of the P-channel transistor P1 is connected to power supply voltage VDD terminal, and source of the N-channel transistor N1 is connected to ground voltage Vss terminal. Moreover, gate of the P-channel transistor P1 is connected to a node ND2 along with drain of the N-channel transistor N1, and gate of the N-channel transistor N1 is connected to a node ND1 along with drain of the P-channel transistor P1. Such a first stable circuit is brought into stable steady-state when potential of the node ND1 becomes equal to power supply voltage VDD, and potential of the node ND2 becomes equal to ground voltage Vss. In other words, the first stable circuit outputs, in the steady state, power supply voltage VDD from the node ND1 of the left side and ground voltage Vss from the node ND2 of the right side.

The second stable circuit shown in FIG. 3 includes a P-channel transistor P2 and an N-channel transistor N2, wherein source of the P-channel transistor P2 and source of the N-channel transistor N2 are respectively connected to power supply voltage VDD terminal and ground voltage Vss terminal, gate of the P-channel transistor P2 is connected to a node ND3 along with drain of the N-channel transistor N2, and gate of the N-channel transistor N2 is connected to a node ND4 along with drain of the P-channel transistor P2. The second stable circuit outputs, in the stable-state, ground voltage Vss from the node ND3 of the left side and power supply voltage VDD from the node ND4 of the right side.

An FPGA according to the first embodiment of this invention includes a basic cell dedicated to memory of a structure as shown in FIG. 1. In this basic cell, the node ND1 of the first stable circuit 1 and the node ND3 of the second stable circuit 2 described above are connected through programmable switch elements 11 and 12 connected in series, and the node ND2 of the first stable circuit 1 and the node ND4 of the second circuit 2 are connected through programmable switch elements 13 and 14 connected in series. Further, source and drain of a data write/read N-channel transistor (first pass transistor) N3 are connected between a node ND5 connecting programmable switch elements 11 and 12 and a first bit line BL, and source and drain of a data write/read N-channel transistor (second pass transistor) N4 are similarly connected between a node ND6 connecting programmable switch elements 13 and 14 and a second bit line/BL. In addition, gates of the transistors N3 and N4 are connected to a common word line WL.

In this example, the above-mentioned programmable switch elements 11~14 are elements such that impedance greately changes before and after programming, and there are elements such that impedance becomes smaller after programming and elements such that impedance becomes greater after programming. As an example of a programmable switch element such that impedance becomes smaller after programming, an equivalent circuit of anti-fuse is shown in FIGS. 4(a) and 4(b).

Figures 4A, 4B:
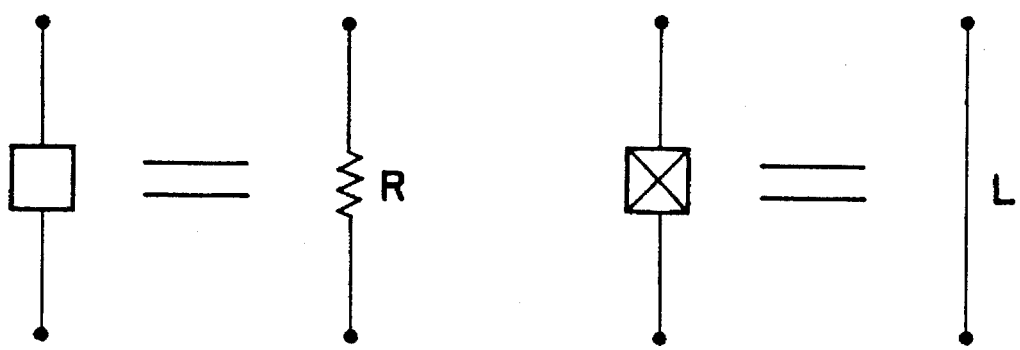
FIGS. 4(a) and 4(b) are circuit diagrams showing equivalent circuits before and after programming of the programmable switch element used in the programmable semiconductor integrated circuit.

When no programming is implemented to the programmable switch element, impedance between terminals is in the state where it is sufficiently large by resistor R as indicated by the equivalent circuit of the right side of FIG. 4(a). On the other hand, when programming is implemented to the programmable switch element, the state of impedance between terminals shifts to the state which has been short-circuited by wiring L as indicated by the equivalent circuit of the right side of FIG. 4(b).

In contrast, in elements such that impedance becomes larger after programming, there results, before programming, an equivalent circuit in which terminals are short-circuited by wiring L, and there results, after programming, an equivalent circuit in which terminals are connected by resistor R having sufficiently large resistance value.

By properly making a selection as to whether or not programming is implemented to the programmable switch elements 11~14 having such property, it is possible to control conductive state between respective nodes ND1~ND6.

Accordingly, by implementing programming to the programmable switch elements 11~14 to suitably set their impedance values, it is possible to selectively connect one of node pair ND1, ND2 of the first stable circuit 1 placed in the steady-state and node pair ND3, ND4 of the second stable state placed in the steady-state to the nodes ND5 and ND6. Thus, a read only memory can be constituted. For example, when programming is carried out so as to connect ND1 to ND5 and to connect ND4 to ND6 to open the word line, potential of the first bit line BL becomes higher than that of the second bit line /BL. On the other hand, when programming is carried out so as to connect ND3 to ND5 and to connect ND4 to ND6 to open the word line, potential of the first bit line BL becomes lower than potential of the second bit line /BL. When such two cases where relative potential difference between the bit lines BL and /BL are detected by sense amplifier (not shown) and read-out operation of data is thus carried out are caused to correspond to "1" memory state and "0" memory state, a read only memory is provided. On the other hand, when the nodes ND1 and ND3 are connected to the node ND5, and the nodes ND2 and ND4 are connected to the node ND6, the first and second stable circuits serve as a bi-stable circuit as a whole, thus making it possible to constitute a rewritable memory cell.

Figure 5A:
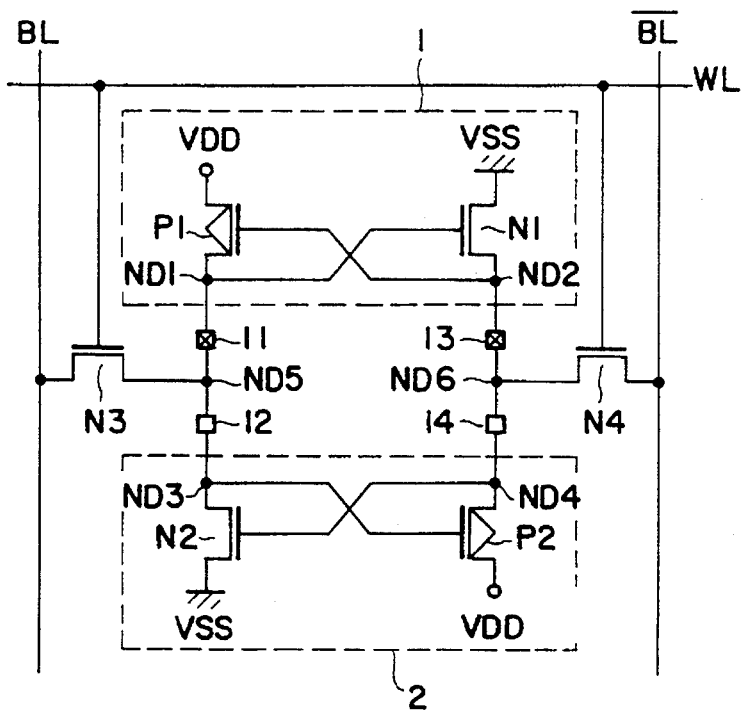
FIGS. 5(a) and 5(b) are circuit diagrams showing the configuration when a read only memory circuit is realized by using the first embodiment of this invention.
Figure 5B:
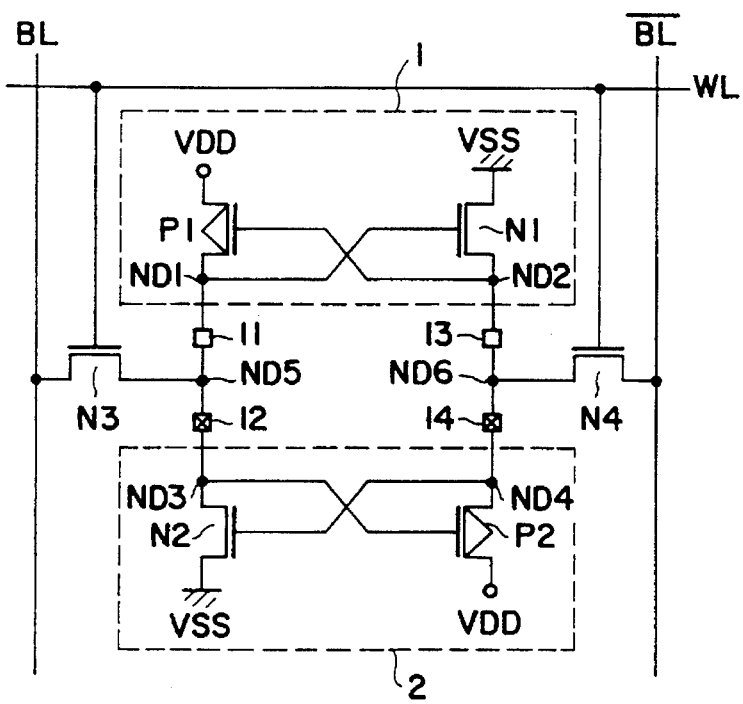

Programming state in the case where a read only memory circuit is constituted by using the first embodiment is shown in FIGS. 5(a) and 5(b). In the case where data of logic "1" level (hereinafter simply referred to as data of logic "1") is written, programming is carried out as shown in FIG. 5(a) so that programmable switch elements 11 and 13 are placed in low impedance state. When word line WL is selected at the time of read-out operation in this state, potential of the bit line BL becomes higher than potential of the bit line /BL.

On the other hand, in the case where data of logic "0" level (hereinafter simply referred to as data of logic "0") is written, programmable switch elements 12 and 14 are placed in low impedance state as shown in FIG. 5(b). In this case, when word line WL is selected, potential of the bit line BL becomes lower than potential of the bit line /BL. Such relative potential difference between bit line pair BL, /BL is detected by sense amplifier (not shown).

Programming procedure in the case where anti-fuse having two terminals and such that when program voltage Vpp of high voltage is applied across the two terminals, the state of impedance between terminals irreversibly shifts to low impedance state is used as the programmable switch elements 11~14 will be described with reference to FIGS. 6(a) and 6(b). This anti-fuse is assumed to have the characteristic that when program voltage Vpp is applied, it is programmed, and when voltage value takes intermediate voltage Vpp/2, it is not programmed.

Figure 6A:
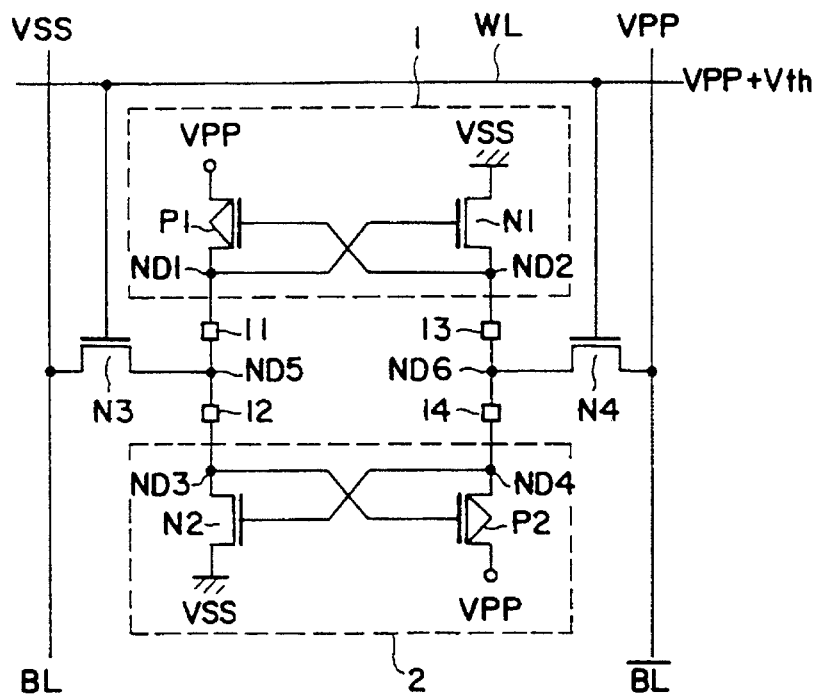
FIGS. 6(a) and 6(b) are circuit diagrams showing voltage application state when the circuit function in the first embodiment of this invention is programmed so that a read only memory circuit is realized.

In the case where data of logic "1" is written, a voltage is applied as shown in FIG. 6(a). Namely, setting is made such that potential of the first bit line BL is equal to ground voltage Vss and potential of the second bit line /BL is equal to program voltage Vpp, and program voltage Vpp is further applied to power supply voltage VDD terminals in the first and second stable circuits 1 and 2. In addition, when threshold voltages of transistors N3 and N4 are assumed to be Vth, potential of the word line WL is set to voltage Vpp+Vth.

In such state where voltage is applied, the transistors N3 and N4 are both in conductive state. Thus, potential of the node ND5 becomes equal to ground voltage Vss similarly to the bit line BL, and potential of the node ND6 becomes equal to program voltage Vpp similarly to the bit line /BL. Potentials of nodes ND1 and ND4 become equal to program voltage Vpp, and potentials of nodes ND2 and ND3 become equal ground voltage Vss. As a result, program voltage Vpp is applied across respective both terminals of programmable switch elements 11 and 13, and the both ends are thus short-circuited. On the other hand, no voltage is applied across respective both terminals of programmable switch elements 12 and 14 thus to maintain high impedance state. Thus, there results the state where data of logic "1" is written.

Figure 6B:
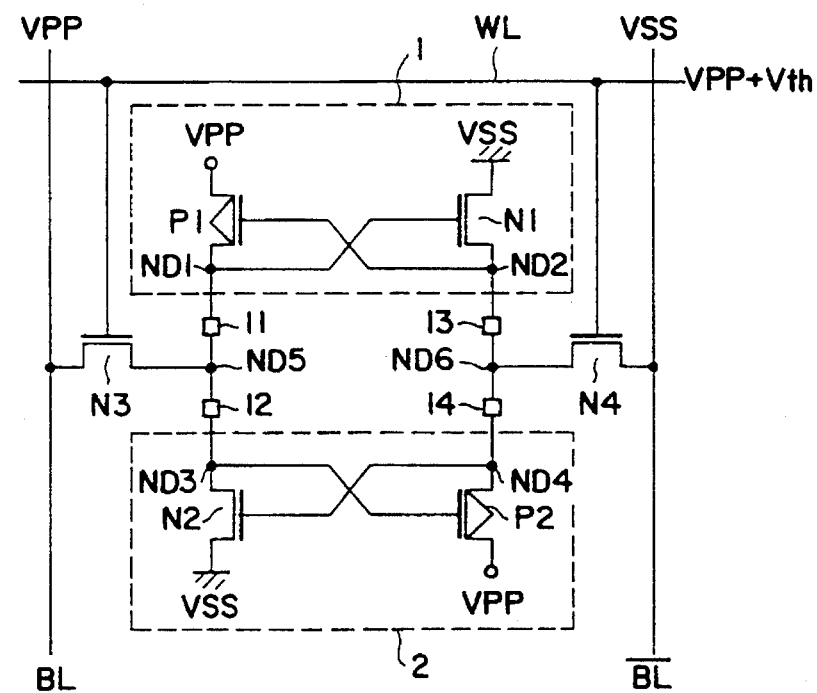

At the time of writing logic "0" data, voltage is applied as shown in FIG. 6(b). Program voltage Vpp is applied to the first bit line BL, and ground voltage Vss is applied to the second bit line /BL. Program voltage Vpp is applied to power supply voltage VDD terminals in the first and second stable circuits 1 and 2, and voltage Vpp+Vth is applied to the word line WL. As a result, transistors N3 and N4 are caused to be both conductive. Thus, the node ND5 becomes equal to program voltage Vpp, and the node ND6 becomes equal to ground voltage Vss. Since potentials of the nodes ND1 and ND4 are program voltage Vpp, and potentials of nodes ND2 and ND3 are ground potential Vss, program voltage Vpp is applied across respective both terminals of the programmable switch elements 12 and 14. The both terminals are placed in short-circuited state. Thus, the programmable switch elements 11 and 13 maintain high impedance state. As a result, there results the state where data of logic "0" is written.

Figure 7:
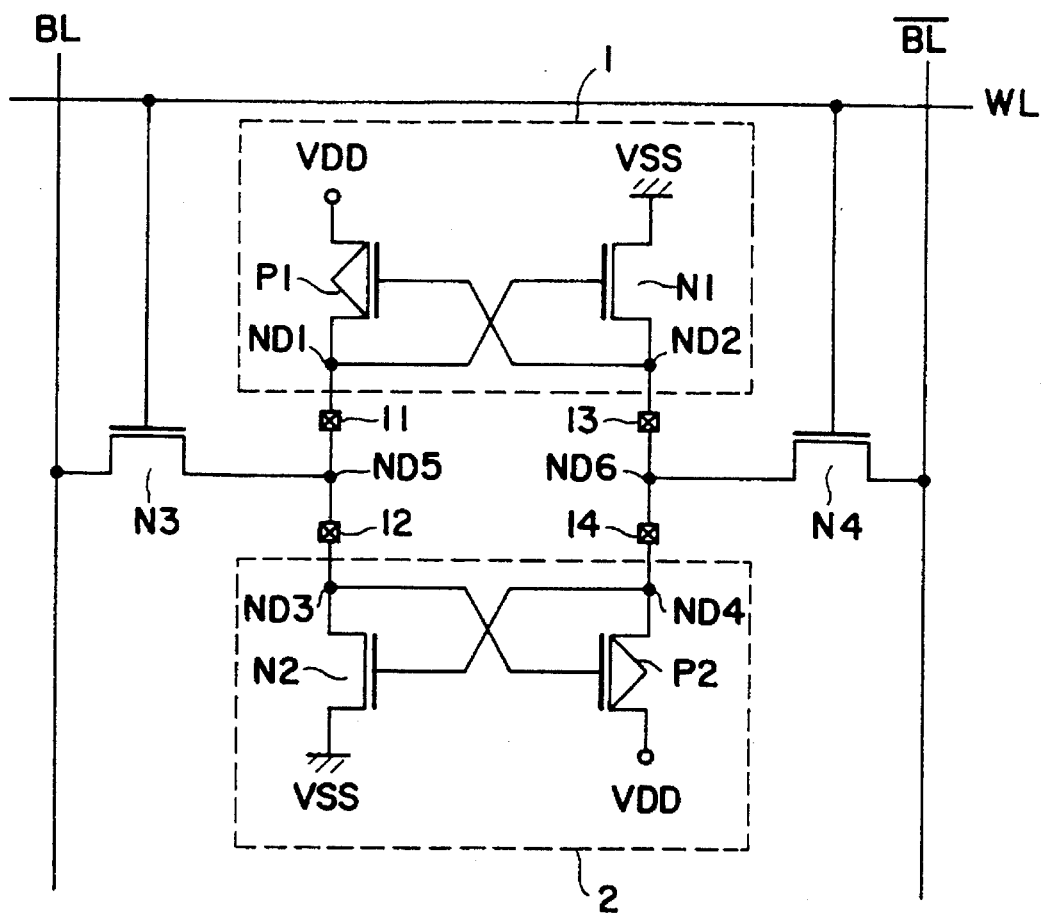
FIG. 7 is a circuit diagram showing the configuration when a rewritable memory circuit is realized by using the first embodiment of this invention.

The case where a rewritable memory circuit is constituted by using the first embodiment will now be described. In this case, it is sufficient to program programmable switch elements 11~14 so that they are all placed in low impedance state as shown in FIG. 7.

Figure 8A:
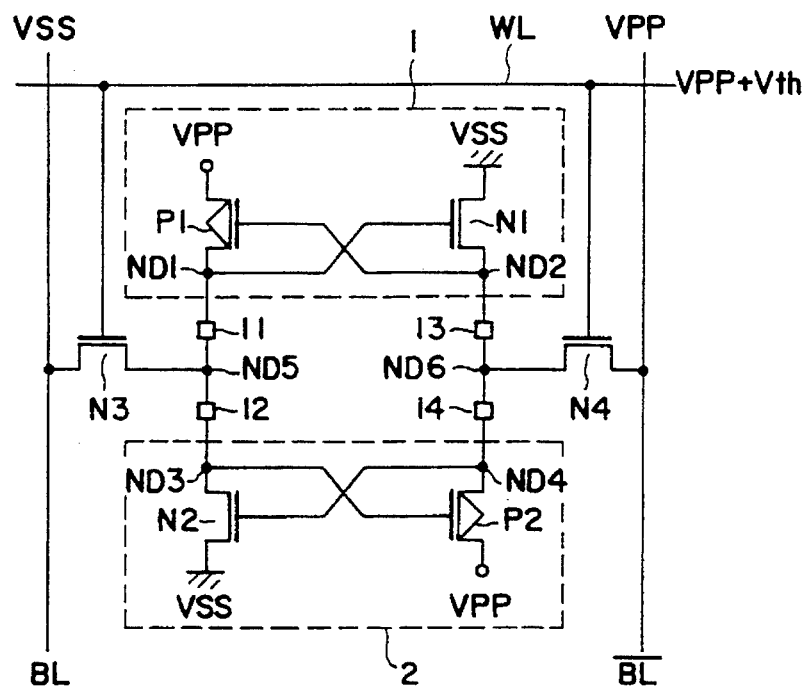
FIGS. 8(a) and 8(b) are circuit diagrams showing voltage application state when the circuit function in the first embodiment of this invention is programmed so that a rewritable memory circuit is realized.

The programming procedure in this case will be described with reference to FIGS. 8(a) and 8(b). Initially, as shown in FIG. 8(a), potential of the first bit line BL is caused to be ground voltage Vss and potential of the second bit line /BL is caused to be program voltage Vpp. Program voltage Vpp is applied to power supply voltage VDD terminal within the first and second stable circuits 1, 2 to set potential of word line WL to voltage Vpp+Vth. At this time, the transistors N3 and N4 are caused to be both conductive. As a result, potential of the node ND5 becomes equal to ground voltage Vss and potential of the node ND6 becomes equal to program voltage Vpp. On the other hand, since poptentials of the nodes ND1 and ND4 become equal to program voltage Vpp, and potentials of nodes ND2 and ND3 become equal to gorund voltage Vss, program voltage Vpp is applied across respective both terminals of the programmable switch elements 11 and 13, and the both terminals thereof are thus short-circuited.

Figure 8B:
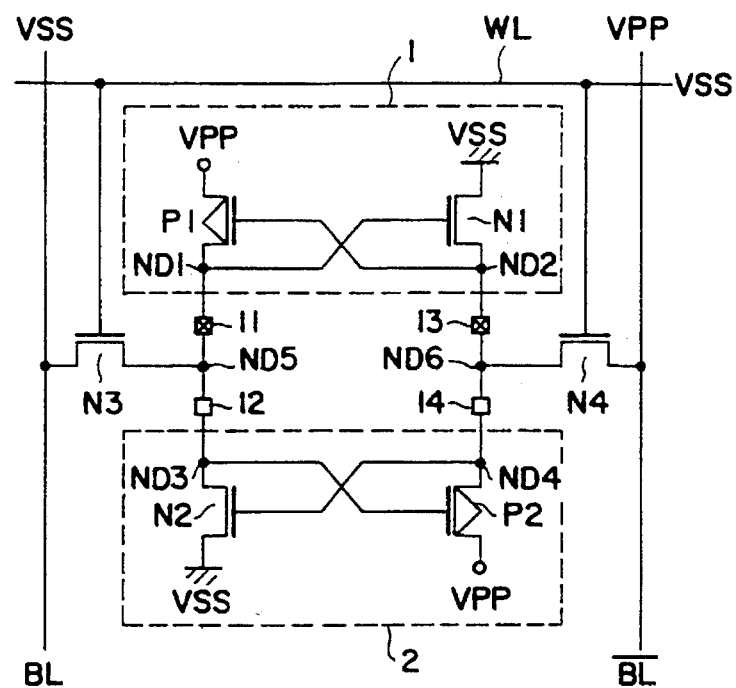

When ground voltage Vss is applied to the word line WL as shown in FIG. 8(b) from the above-mentioned state, the transistors N3 and N4 both change to non-conductive state. As a result, potential of the node ND5 changes to program voltage Vpp, and potential of the node ND6 changes to ground voltage Vss. The node ND3 maintains ground voltage Vss, and the node ND4 maintains program voltage Vpp. Thus, program voltage Vpp is applied across respective both terminals of the programmable switch elements 12 and 14, and those switch elements 12 and 14 are thus short-circuited.

When programming is carried out by such a procedure, all the programmable switch elements 11~14 are placed in short-circuited state, and are caused to serve as a rewritable memory circuit operative as a bistable circuit.

Write operation of logic "0" data into the rewritable memory cell constituted by user in this way is carried out by respectively setting potentials of the bit line BL, the bit line /BL and the word line to ground voltage Vss, power supply voltage VDD and power supply voltage VDD. Moreover, write operation of logic "1" data may be carried out by respectively setting potentials of the bit line BL, the bit line /BL and the word line WL to power supply voltage VDD, ground voltage Vss and power supply voltage VDD. When potential of the word line is raised at the time of read-out operation, a potential difference corresponding to data written between bit line pair BL and /BL is detected by the sense amplifier.

Figure 9:
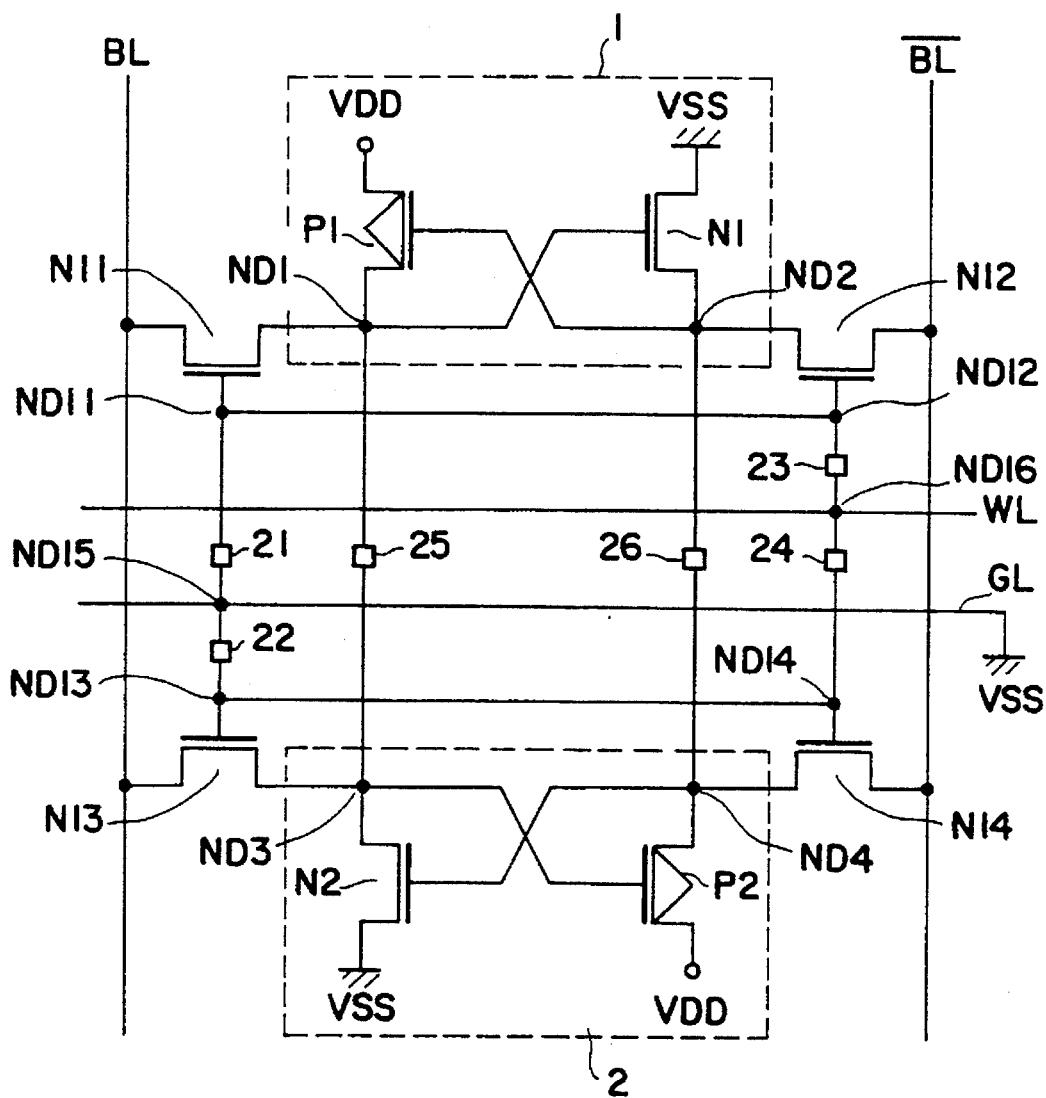
FIG. 9 is a circuit diagram showing the configuration of a programmable semiconductor integrated circuit according to a second embodiment of this invention.

The configuration of a second embodiment of this invention is shown in FIG. 9. Programmable switch elements 25, 26 are respectively connected between node ND1 of first stable circuit 1 and node N3 of second stable circuit 2 and between node ND2 of first stable circuit 1 and ND4 of second stable circuit 2. Source and drain of a write/read N-channel transistor N11 are connected to the node ND1 and the first bit line BL. Similarly, source and drain of an N-channel transistor N12 are connected to the node ND2 and the second bit line /BL, source and drain of an N-channel transistor N13 are connected to the node ND3 and the first bit line BL, and source and drain of an N-channel transistor N14 are connected to the node ND4 and the second bit line /BL. Gate of the transistor N11 and gate of the transistor N12 are connected, and gate of the transistor N13 and gate of the transistor N14 are connected. Programmable switch elements 21 and 22 are connected in series between the gate of the transistor N11 and the gate of the tradnsistor N13, and programmable switch elements 23 and 24 are connected in series between the gate of the transistor N12 and the gate of the transistor N14. A connection node ND15 of the programmable switch element 21 and the programmable switch element 22 is connected to ground potential terminal, and a connection node ND16 of the programmable switch element 23 and the programmable switch element 24 is connected to the word line WL. By implementing programming to these programmable switch elements 21~24, it is possible to programmably connect the gates of the transistors N11~N14 to either the word line WL or the ground line GL.

Figure 10A:
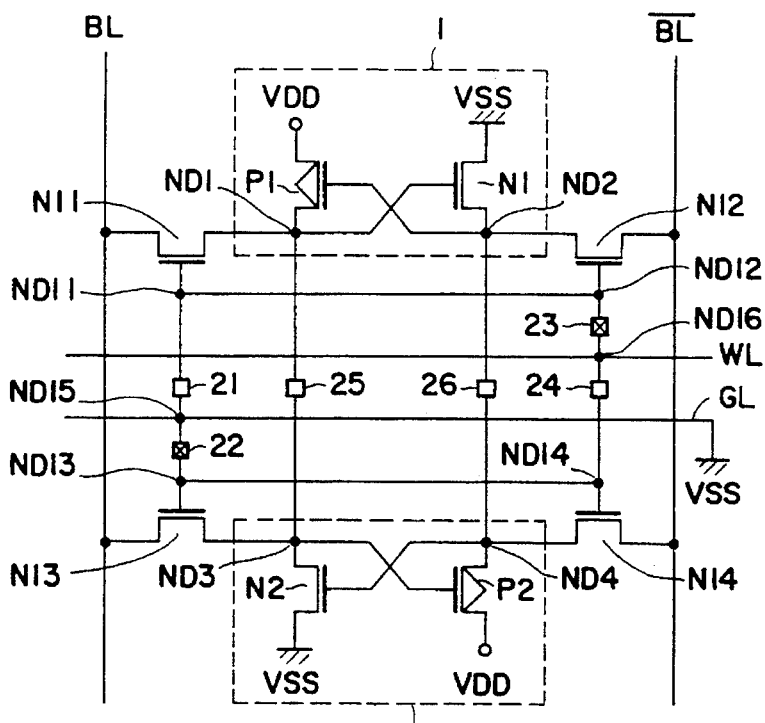
FIGS. 10(a) and 10(b) are circuit diagrams showing the configuration when a read only memory circuit is realized by using the second embodiment of this invention.
Figure 10B:
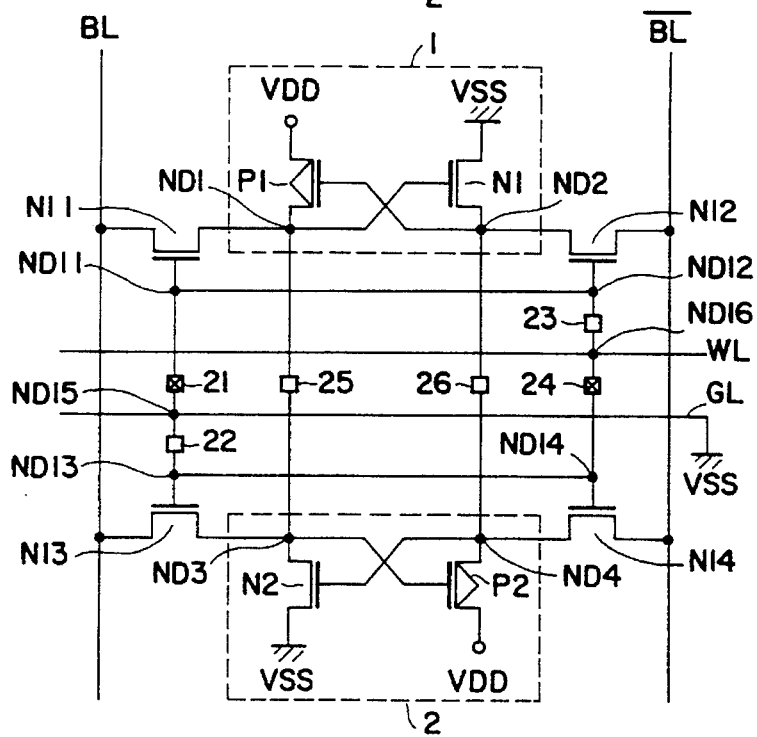

The case where a read only memory circuit is constituted by using the second embodiment will be described with reference to FIGS. 10(a) and 10(b). In the case where logic "1" data is written, voltage is applied as shown in FIG. 10(a) so that programmable switch elements 22 and 23 are short-circuited. Actual programming procedure will be described later. When potential of the word line WL is raised in order to carry out read-out operation of data from the state where logic "1" data is written, potential of the first bit line BL becomes higher than that of the second bit line /BL. On the other hand, when logic "0" data is written, voltage is applied as shown in FIG. 10(b) so that programmable switch elements 21 and 24 are short-circuited. When potential of the word line WL is raised in this state, potential of the first bit line BL becomes lower than that of the second bit line /BL. A relative potential difference between bit lines BL and /BL is detected by sense amplifier (not shown). Thus, read-out operation of data is carried out.

Figure 11A:
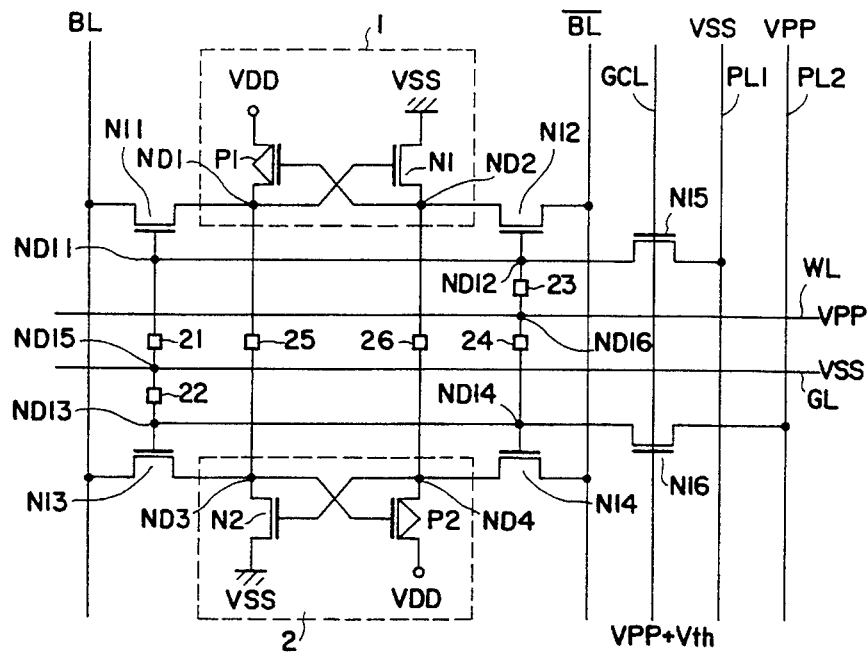
FIGS. 11(a) and 11(b) are circuit diagrams showing voltage application state when the circuit function in the second embodiment of this invention is programmed so that a read only memory circuit is realized.

Programming procedure when logic "1" data is written will be described with reference to FIG. 11(a). In this example, N-cannel transistors N15 and N16 correspond to a program transistor, wherein their gates are connected commonly to a gate control line GCL, their sources are respectively connected to nodes ND12, ND14, and their drains are respectively connected to program voltage supply lines PL1, PL2. Voltage Vpp+Vth is applied to the gate control line GCL, and ground voltage Vss and program voltage Vpp are respectively applied to the program voltage supply lines PL1, PL2. In addition, program voltage Vpp is applied to the word line WL, and ground voltage Vss is applied to ground line GL.

When voltage is applied in this way, program voltage Vpp is applied across respective both terminals of the programmable switch elements 22 and 23, so both switch elements are short-circuited. Thus, conduction of transistors N11 and N12 is controlled by word line WL. As a result, the transistors N13 and N14 maintain OFF state irrespective of potential of the word line WL. When potential of the word line is raised at the time of read-out operation, the transistors N11 and N12 are turned ON. As a result, potential of the first bit line BL becomes higher than potential of the second bit line /BL. Thus, logic "1" data is read out.

Figure 11B:
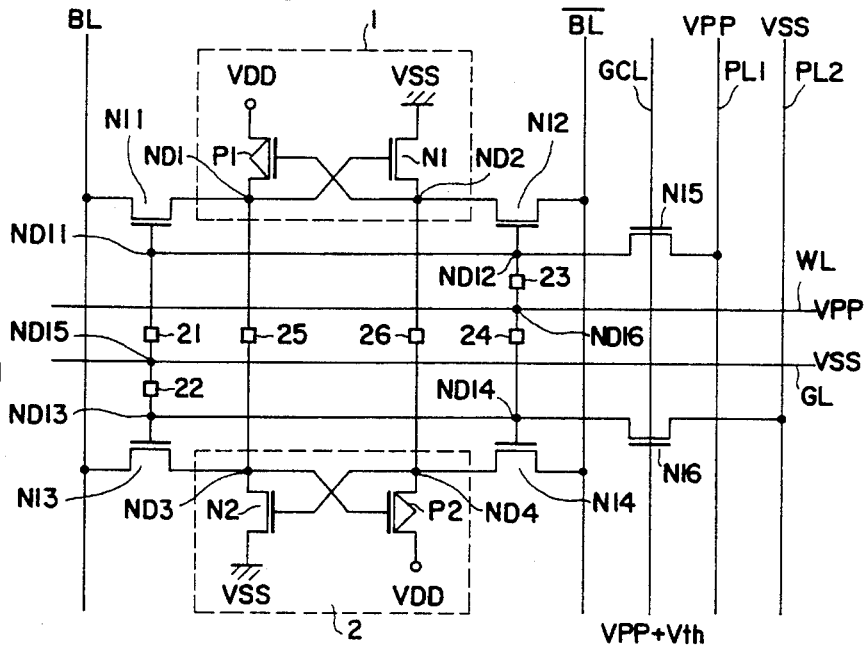

When logic "0" data is written, voltage is applied as shown in FIG. 11(b). Voltage Vpp+Vth is applied to the gate control line GCL, and program voltage Vpp and ground voltage Vss are respectively applied to program voltage supply lines PL1, PL2. Program voltage Vpp is applied to the word line WL, and ground voltage Vss is applied to the ground line GL. When voltage is applied in this way, program voltage Vpp is applied across respective both terminals of the programmable switch elements 21 and 24, and those switch elements are short-circuited. After programming, the transistors N11 and N12 maintain OFF state irrespective of the voltage of the word line WL. Thus, conduction of the transistors N13 and N14 is controlled by the word line WL. When potential of the word line WL is raided at the time of read-out operation, the transistors N13 and N14 are caused to be conductive. As a result, potential of the first bit line BL becomes lower than that of the second bit line /BL. In this way, data of logic "0" is read out.

Figure 12:
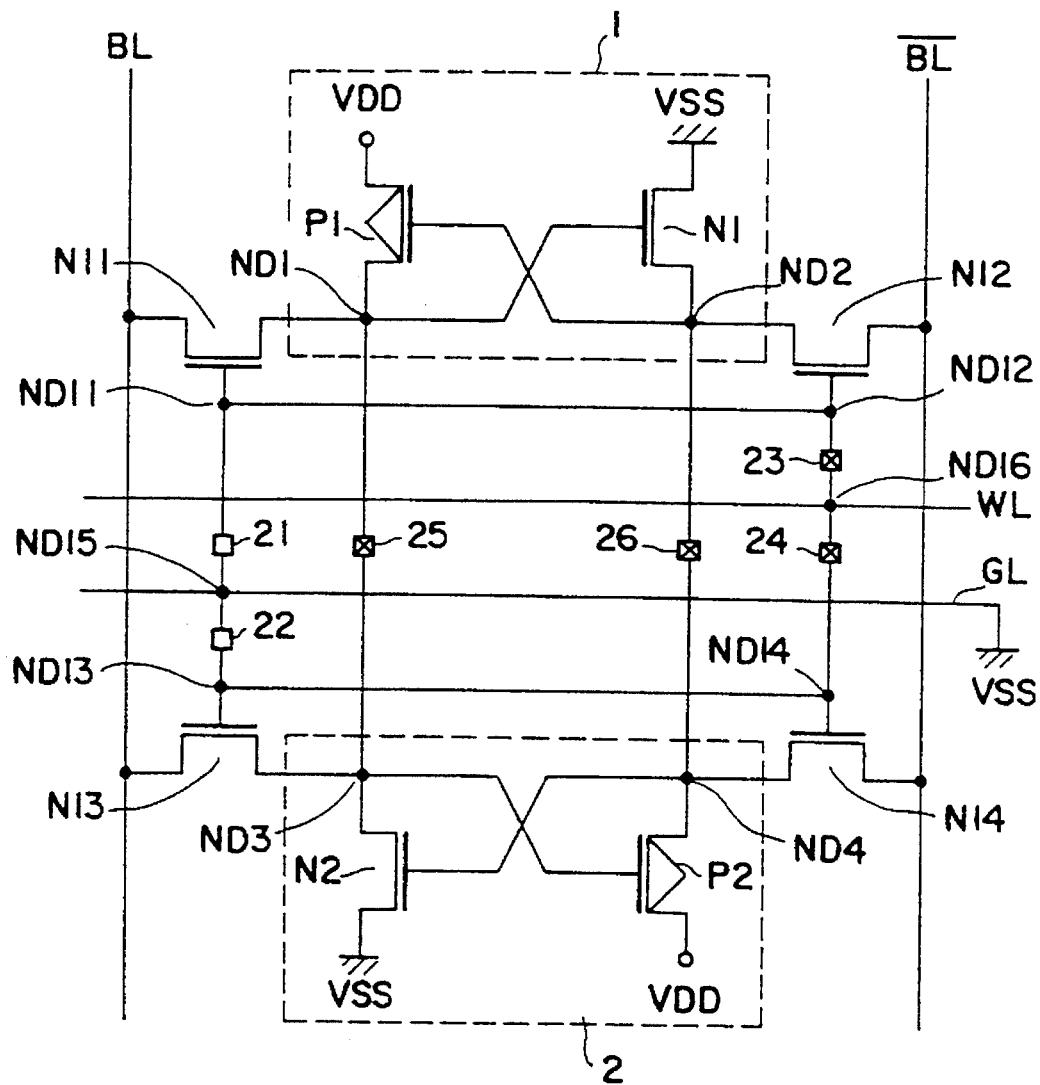
FIG. 12 is a circuit diagram showing the configuration when a rewritable memory circuit is realized by the second embodiment of this invention.

In the case where a rewritable memory circuit is constituted by using the second embodiment, programming is carried out as shown in FIG. 12 so that programmable switch elements 23~26 have low impedance. The programming procedure at this time is shown in FIGS. 13(a) and 13(b).

Figure 13A:
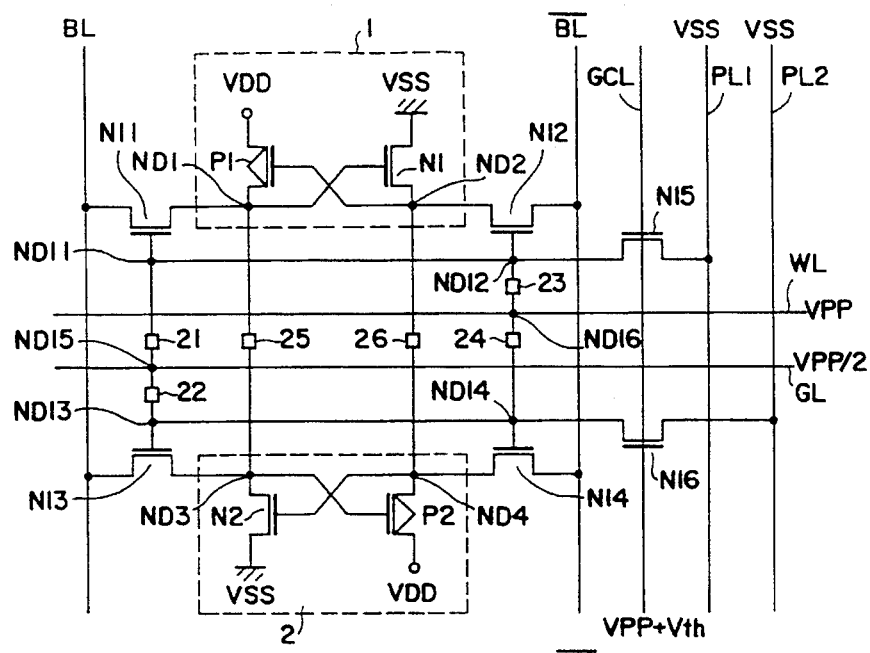
FIGS. 13(a) and 13(b) are circuit diagrams showing voltage application state when the circuit function in the second embodiment of this invention is programmed so that a rewritable memory circuit is realized.

Initially, as shown in FIG. 13(a), voltage Vpp+Vth is applied to the gate control line GCL, and ground voltage Vss is applied to the program voltage supply lines PL1, PL2. Program voltage Vpp is applied to the word line WL, and Vpp/2 is applied to the ground line GL. Thus, program voltage Vpp is applied across respective both terminals of the programmable switch elements 23 and 24, and those switch elements are short-circuited.

Figure 13B:
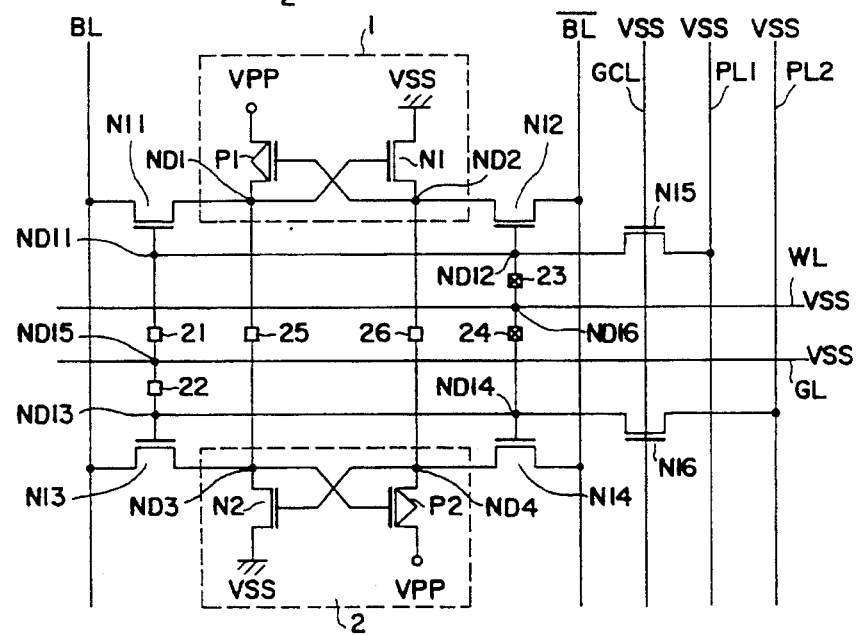

Then, as shown in FIG. 13(b), program voltage Vpp is applied to the power supply voltage VDD terminal within the first and second stable circuits 1 and 2, and ground voltage Vss is applied to the gate control line GCL. Moreover, the word line WL and the ground line GL are caused to be both ground potential Vss. At this time, the transistors N11~N16 are all placed in non-conductive state. As a result, the nodes ND1 and ND4 become equal to the program voltage Vpp, and the nodes ND2 and ND3 become equal to the ground voltage Vss. Program voltage Vpp is applied across respective both terminals of the programmable switch elements 25 and 26, and those switch elements are short-circuited. As a result, the programmable switch elements 23~26 are short-circuited. Thus, a rewritable memory circuit operative as a bistable circuit is realized.

When logic "0" data is written, potential of the first bit line BL is set to ground voltage Vss, and potential of the second bit line /BL is set to power supply voltage VDD. In addition, VDD is applied to the word line WL, thus allowing the transistors N11~N14 to be conductive.

When logic "1" data is written, potential of the bit line BL is set to power supply voltage VDD, and potential of the bit line /BL is set to ground voltage Vss. In addition, VDD is applied to the word line WL, thus allowing the transistors N11~N14 to be conductive. When potential of the word line WL is raised at the time of read-out operation, a potential difference corresponding to the written data is produced between the first bit line BL and the second bit line /BL. This potential difference is detected by sense amplifier (not shown).

The configuration, the operation and the programming method in the case where the read only memory circuit, or the rewritable memory circuit is realized by using FPGA according to the first and second embodiments have been described above. In these embodiments, as a basic cell for constituting the memory circuit, first and second stable circuits which can be constituted by lesser number of transistors than transistors constituting the conventional FPGA cell are used as a dedicated cell. For this reason, in realization of the memory circuit, area efficiency and wiring resource utilization efficiency can be improved to more degree as compared to the conventional FPGA.

It should be noted that the above-described embodiments are presented only for illustrative purpose, and does not limit this invention by any means.

For example, while N-channel transistor is used as write/read transistor in all of the embodiments, P-channel transistor may be used for this purpose. Moreover, while anti-fuse element is used in the embodiments as the programmable switch element, any element adapted to become high impedance state after programming in a manner opposite to the above may be used. In addition, the programmable semiconductor integrated circuit of this invention is not limited to the circuit configurations illustrated in the figure, but may be diversely modified within the range which does not depart from the gist of this invention.

What is claimed is:

1. A programmable semiconductor integrated circuit comprising basic cells each comprised of:

a first stable circuit having first and second nodes and operative to respectively output, in the steady state, power supply potential and ground potential from the first and second nodes;

a second stable circuit having third and fourth nodes and operative to respectively output, in the steady state, ground potential and power supply potential from the third and fourth nodes; and a control circuit for selectively connecting any one of a node pair comprised of the first and second nodes of the first stable circuit and a node pair comprised of the third and fourth nodes of the second stable circuit, or the both node pairs to first and second bit lines.

2. A programmable semiconductor integrated circuit as set forth in claim 1, wherein the function of the control circuit is programmed to thereby permit the basic cell to have any one of a read only memory cell and a rewritable memory cell.

3. A programmable semiconductor integrated circuit as set forth in claim 1, wherein the first stable circuit includes a first P-channel transistor having a source connected to a power supply potential terminal, a drain connected to the first node, and a gate connected to the second node, and a first N-channel transistor having a source connected to a ground potential terminal, a drain connected to the second node, and a gate connected to the first node, thus to respectively output, in the steady state, power supply potential and ground potential from the first and second nodes, and wherein the second stable circuit includes a second P-channel transistor having a source connected to the power supply potential terminal, a gate connected to the third node, and a drain connected to the fourth node, and a second N-channel transistor having a source connected to the ground potential terminal, a drain connected to the third node, and a gate connected to the fourth node, thus to respectively output, in the steady state, ground potential and power supply potential from the third and fourth nodes.

4. A programmable semiconductor integrated circuit as set forth in claim 1, wherein the control circuit has programmable switch means whose impedance irreversibly becomes lower after programming.

5. A programmable semiconductor integrated circuit as set forth in claim 1, wherein the control circuit has programmable switch means whose impedance irreversibly becomes higher after programming.

6. A programmable semiconductor integrated circuit as set forth in claim 1, wherein the control circuit includes first and second programmable switch elements connected in series between the first node and the third node, and third and fourth programmable switch elements connected in series between the second node and the fourth node, and wherein in the case where the basic cell is used as a read only memory cell, only the first and third programmable switch elements are caused to have low impedance, or only the second and fourth programmable switch elements are caused to have low impedance, and wherein in the case where the basic cell is used as a rewritable memory cell, the first to fourth programmable switch elements are caused to all have low impedance so that a bistable circuit is constituted by the first stable circuit and the second stable circuit.

7. A programmable semiconductor integrated circuit as set forth in claim 1, wherein the control circuit includes first and second programmable switch elements connected in series between the first node and the third node, and third and fourth programmable switch elements connected in series between the second node and the fourth node, and wherein the control circuit further comprises: a first pass transistor having a source and a drain connected to a fifth node connecting the first and second programmable switch elements connected in series and to the first bit line; and a second pass transistor having a source and a drain connected to a sixth node connecting the third and fourth programmable switch elements connected in series and to the second bit line, gates of the first and second pass transistors being connected to a common word line.

8. A programmable semiconductor integrated circuit as set forth in claim 7, wherein the first stable circuit includes a first P-channel transistor having a source connected to the power supply potential terminal, a drain connected to the first node, and a gate connected to the second node, and a first N-channel transistor having a source connected to the ground potential terminal, a drain connected to the second node, and a gate connected to the first node, thus to respectively output, in the steady state, power supply potential and ground potential from the first and second nodes, and wherein the second stable circuit includes a second P-channel transistor having a source connected to the power supply potential terminal, a gate connected to the third node, and a drain connected to the fourth node, and a second N-channel transistor having a source connected to the ground potential terminal, a drain connected to the third node, and a gate connected to the fourth node, thus to respectively output, in the steady state, ground potential and power supply potential from the third and fourth nodes.

9. A programmable semiconductor integrated circuit as set forth in claim 7, wherein the first, second, third and fourth programmable switch means are elements such that impedances irreversibly become lower after programming.

10. A programmable semiconductor integrated circuit as set forth in claim 7, wherein the first, second, third and fourth programmable switch means are elements such that impedances irreversibly become higher after programming.

11. A programmable semiconductor integrated circuit as set forth in claim 1, the control circuit comprising:

a first programmable switch element connected between the first node and the third node, and a second programmable switch element connected between the second node and the fourth node;

a first transistor having a source and a drain connected to the first node and the first bit line;

a second transistor having a source and a drain connected to the second node and the second bit line, and a gate connected to a gate of the first transistor;

a third transistor having a source and a drain connected to the third node and the first bit line;

a fourth transistor having a source and a drain connected to the fourth node and the second bit line, and a gate connected to a gate of the third transistor;

third and fourth programmable switch elements connected in series between the gate of the first transistor and the gate of the third transistor; and fifth and sixth programmable switch elements connected in series between the gate of the second transistor and the gate of the fourth transistor, a fifth node connecting the third and fourth programmable switch elements connected in series being connected to a terminal of a potential sufficient to allow the first to fourth transistors to be turned OFF, a sixth node connecting the fifth and sixth programmable switch elements connected in series being connected to a word line.

12. A programmable semiconductor integrated circuit as set forth in claim 11, wherein the first stable circuit includes a first P-channel transistor having a source connected to the power supply potential terminal, a drain connected to the first node, and a gate connected to the second node, and a fist N-channel transistor having a source connected to the ground potential terminal, a drain connected to the second node, and a gate connected to the first node, thus to respectively output, in the steady state, power susppply potential and ground potential from the first and second nodes, and wherein the second stable circuit includes a second P-channel transistor having a source connected to the power supply potential terminal, a gate connected to the third node, and a drain connected to the fourth node, and a second N-channel transistor having a source connected to the ground potential terminal, a drain connected to the third node, and a gate connected to the fourth node, thus to respectively output, in the steady state, ground potential and power supply potential from the third and fourth nodes.

13. A programmable semiconductor integrated circuit as set forth in claim 11, wherein the first, second, third, fourth, fifth and sixth programmable switch means are elements such that impedances irreversibly become lower after programming.

14. A programmable semiconductor integrated circuit as set forth in claim 11, wherein the programmable switch means are elements such that impedances irreversibly become higher after programming.

15. A programmable semiconductor integrated circuit as set forth in claim 1, the control circuit comprising:

a first programmable switch element connected between the first node and the third node, and a second programmable switch element connected between the second node and the fourth node;

a first transistor having a source and a drain connected to the first node and the first bit line;

a second transistor having a source and a drain connected to the second node and the second bit line, and a gate connected to a gate of the first transistor;

a third transistor having a source and a drain connected to the third node and the first bit line;

a fourth transistor having a source and a drain connected to the fourth node and the second bit line, and a gate connected to a gate of the third transistor;

third and fourth programmable switch elements connected in series between the gate of the first transistor and the gate of the third transistor; and fifth and sixth programmable switch elements connected in series between the gate of the second transistor and the gate of the fourth transistor, a fifth node connecting the third and fourth programmable switch elements connected in series being connected to a terminal of a potential sufficient to allow the first to fourth transistors to be turned OFF, a sixth node connecting the fifth and sixth programmable switch elements connected in series being connected to a word line, wherein in the case where the basic cell is used as a read only memory cell, only the third and sixth programmable switch elements are caused to have low impedance, or only the fourth and fifth programmable switch elements are caused to have low impedance, and wherein in the case where the basic cell is used as a rewritable memory cell, the first and second programmable switch elements, and the fifth and sixth programmable switch elements are caused to have low impedance.

16. A programmable semiconductor integrated circuit as set forth in claim 15, wherein the first stable circuit includes a first P-channel transistor having a source connected to the power supply potential terminal, a drain connected to the first node, and a gate connected to the second node, and a first N-channel transistor having a source connected to the ground potential terminal, a drain connected to the second node, and a gate connected to the first node, thus to respectively output, in the steady state, power supply potential and ground potential from the first and second nodes, and wherein the second stable circuit includes a second P-channel transistor having a source connected to the power supply potential terminal, a gate connected to the third node, and a drain connected to the fourth node, and a second N-channel transistor having a source connected to the ground potential terminal, a drain connected to the third node, and a gate connected to the fourth node, thus to respectively output, in the steady state, ground potential and power supply potential from the third and fourth nodes.

17. A programmable semiconductor integrated circuit as set forth in claim 15, wherein the first, second, third, fourth, fifth and sixth programmable switch means are elements such that impedances irreversibly become lower after programming.

18. A programmable semiconductor integrated circuit as set forth in claim 15, wherein the first, second, third, fourth, fifth and sixth programmable switch means are elements such that impedances irreversibly become higher after programming.

19. A programmable semiconductor integrated circuit as set forth in claim 15, wherein a source and a drain of a fifth transistor are connected between a seventh node connecting the gate of the first transistor and the gate of the second transistor and a first program voltage supply line to which a first program voltage is applied, wherein a source and a drain of a sixth transistor is connected between an eighth node connecting the gate of the third transistor and the gate of the fourth transistor and a second program voltage supply line to which a second voltage is applied, and wherein gates of the fifth and sixth transistors are connected commonly to a gate control line.

20. A programmable semiconductor integrated circuit as set forth in claim 19, wherein the first stable circuit includes a first P-channel transistor having a source connected to the power supply potential terminal, a drain connected to the first node, and a gate connected to the second node, and a first N-channel transistor having a source connected to the ground potential terminal, a drain connected to the second node, and a gate connected to the first node, thus to respectively output, in the steady state, power supply potential and ground potential from the first and the second nodes, and wherein the second stable circuit includes a second P-channel transistor having a source connected to the power supply potential terminal, a gate connected to the third node, and a drain connected to the fourth node, and a second N-channel transistor having a source connected to the ground potential terminal, a drain connected to the third node, and a gate connected to the fourth node, thus to respectively output, in the steady state, ground potential and power supply potential from the third and fourth nodes.

21. A programmable semiconductor integrated circuit as set forth in claim 19, wherein the first, second, third, fourth, fifth and sixth programmable switch means are elements such that impedances irreversibly becomes lower after programming.

22. A programmable semiconductor integrated circuit as set forth in claim 19, wherein the first, second, third, fourth, fifth and sixth programmable switch means are elements such that impedances irreversibly becomes higher after programming.

* * * * *